United States Patent
Darshan (10) Patent No.: US 10,027,493 B2
(45) Date of Patent: Jul. 17, 2018

(54) POE POWER UTILIZATION ARRANGEMENT AND METHOD

(71) Applicant: Microsemi Corp.—Analog Mixed Signal Group, Ltd., Hod Hasharon (IL)

(72) Inventor: Yair Darshan, Petach Tikva (IL)

(73) Assignee: Microsemi P.O.E. Ltd., Hod Hasharon (IL)

( * ) Notice: Subject to any disclaimer, the term of this patent is extended or adjusted under 35 U.S.C. 154(b) by 313 days.

(21) Appl. No.: 15/043,635

(22) Filed: Feb. 15, 2016

(65) Prior Publication Data

US 2016/0241406 A1    Aug. 18, 2016

Related U.S. Application Data

(60) Provisional application No. 62/116,937, filed on Feb. 17, 2015.

(51) Int. Cl.
| | | |
|---|---|---|
| *H04L 12/10* | (2006.01) | |
| *G01R 27/16* | (2006.01) | |
| *H04L 12/40* | (2006.01) | |
| *G01R 27/08* | (2006.01) | |

(52) U.S. Cl.
CPC ........ *H04L 12/10* (2013.01); *H04L 12/40045* (2013.01); *G01R 27/08* (2013.01); *G01R 27/16* (2013.01)

(58) Field of Classification Search
CPC ... H04L 12/10; H04L 12/40013; G01R 27/16; G01R 27/04; G01R 27/08
See application file for complete search history.

(56) References Cited

U.S. PATENT DOCUMENTS

| | | | |
|---|---|---|---|
| 7,417,443 B2 * | 8/2008 | Admon | H04L 12/10 324/522 |
| 8,779,786 B2 * | 7/2014 | Maniktala | H04L 12/12 324/526 |
| 9,851,772 B2 * | 12/2017 | Dwelley | G06F 1/3206 |
| 2006/0164108 A1 | 7/2006 | Herbold | |
| 2008/0164890 A1 | 7/2008 | Admon et al. | |
| 2008/0311877 A1 | 12/2008 | Darshan | |
| 2010/0182024 A1 | 7/2010 | Yu | |
| 2014/0111009 A1 | 4/2014 | Ruef | |

OTHER PUBLICATIONS

HDbaseT Specification Version 1.1.0; pp. 151-187, published Jul. 12, 2011 by HDBaseT Alliance, Portland, Oregon.

(Continued)

*Primary Examiner* — Ryan Johnson
(74) *Attorney, Agent, or Firm* — Simon Kahn (57) ABSTRACT

A PoE power utilization method constituted of: detecting a first function of a voltage between a current path node and a current return path node during a first time period and during a second time period, the second time period different than the first time period; sensing a second function of the magnitude of a current flowing through the current path during the second time period; responsive to the detected first time period voltage function, the detected second time period voltage function and the sensed second time period current magnitude function, determining a third function of a resistance seen by the current path; and outputting an indication of the determined resistance function.

14 Claims, 4 Drawing Sheets

(56) References Cited

OTHER PUBLICATIONS

IEEE Computer Society; "IEEE std 802.af-2003"; pp. 29-57, 94-96, 102, 115; published Jun. 18, 2003; The Institute of Electrical and Electronic Engineers, Inc., New York, NY, 2003.
IEEE Computer Society; "IEEE std 802.af-2009"; pp. 22-67; published Oct. 30, 2009; The Institute of Electrical and Electronic Engineers, Inc., New York, NY, 2003.
International Search Report for parallel PCT/IL2016/050176 issued by the European Patent Office dated Jun. 3, 2016.
Written Opinion of the International Searching Authority for parallel PCT/IL2016/050176 issued by the European Patent Office dated Jun. 3, 2016.

* cited by examiner

POE POWER UTILIZATION ARRANGEMENT AND METHOD

BACKGROUND OF THE INVENTION

The invention relates generally to the field of power over local area networks, particularly Ethernet based networks, and more particularly to a method of power utilization by a powered device receiving power over twisted wire pairs.

Power over Ethernet (PoE), in accordance with both IEEE 802.3af-2003 and IEEE 802.3at-2009, each published by the Institute of Electrical and Electronics Engineers, Inc., New York, the entire contents of each of which is incorporated herein by reference, defines delivery of power over a set of 2 twisted wire pairs without disturbing data communication. The aforementioned standards particularly provide for a power sourcing equipment (PSE) and a powered device (PD). The power sourcing equipment is configured to detect the PD by ascertaining a valid signature resistance, and to supply power over the 2 twisted wire pairs only after a valid signature resistance is actually detected.

The HD BaseT Alliance of Beaverton, Oregon has published the HDBaseT Specification Version 1.1.0 which defines a high power standard utilizing twisted wire pair cabling, such as Category 5e (CAT 5e) or Category 6 (CAT 6) structured cabling as defined by ANSI/TIA/EIA-568-A. The specification provides for even higher power than the above mentioned IEEE 802.3at-2009 over each set of 2 pairs, with all 4 pairs utilized for powering, and allows for power over structured communication cabling from any of: a type 1 PSE, denoted hereinafter as a low power PSE, typically meeting the above mentioned IEEE 802.3af standard; a type 2 PSE denoted hereinafter as a medium power PSE, typically meeting the above mentioned IEEE 802.3at standard; a type 3 PSE, denoted hereinafter as a high power PSE, typically meeting the above HDBaseT specification; twin medium power PSEs; and twin high power PSEs.

In the PoE process, a valid device detection is first performed. This detection process identifies whether or not the PSE is connected to a valid PD to ensure that power is not applied to non-PoE capable devices. After a valid PD is discovered, the PSE can optionally perform a power classification. For example, in the IEEE 802.3af standard, the classification phase identifies a power classification of the PD from among a variety of power classes.

After the classification phase is complete, the PSE is arranged to allocate power to the port in accordance with the power classification. Particularly, the PSE is arranged to provide power to a detected PD only if it is determined that enough power is available to be allocated. For a class 1 PD, the PSE allocates 4.0 W. For a class 2 PD, the PSE allocates 7.0 W. For a class 3 PD, the PSE allocates 15.4 W. Although the PSE allocates the above power amounts, the PD is not authorized to consume the entire allocated amount of power. Particularly, a class 1 PD is allowed to consume up to 3.84 W, a class 2 PD is allowed to consume up to 6.49 W and a class 3 PD is allowed to consume up to 12.95 W. The difference between the amount of power allocated by the PSE and the amount of power consumed by the PD accounts for power loss between the PSE and the PD due to the resistance of the data wires and other components. For example, if the PD draws 300 mA of current, a Category 3 (CAT 3) cable exhibiting a resistance of 20Ω over 100 meters will cause a power loss of 1.8 W, as shown in EQ. 1:

$$PL = I^2 * R \quad \text{EQ. 1}$$

where PL is the power loss, I is the current drawn through the cable and R is the total resistance of the cable.

As shown in EQ. 1, the power loss is proportional to the resistance of the cable. As a result, a cable of a shorter length, which exhibits a lower resistance, will cause a proportionally smaller power loss. For example, a 300 mA current flowing through a CAT 3 cable of 10 meters will meet a resistance of only 2Ω. Therefore, the power loss through the cable will be only 0.18 W, 1.62 W less than the power loss through a 100 meter long cable. Additionally, a cable exhibiting a lower resistance will cause a proportionally lower power loss. For example, a 300 mA current flowing through a CAT 6 cable of 100 meters will meet a resistance of only 7Ω. Therefore, the power loss through the cable will be only 0.63 W, 1.17 W less than the power loss through a 100 meter long CAT 3 cable.

In summary, in many cases the PSE allocates more power than is required by the combination of the PD power draw and the cable loss between the PSE and the PD. One way of utilizing this excess power is by having the PSE determine the actual cable loss, and adding the unutilized power to the PSE's power budget for other PDs. Another way of utilizing this excess power would be by allowing the PD to consume more power than the maximum rating of its class. For example, as described above, for a class 3 PD the PSE allocates an additional 2.45 W of power to compensate for power loss between the PSE and PD. In the event that the cable resistance is such that the maximum power loss is 1 W, the PD will be allowed to consume an additional 1.45 W of power. In order to allow such an increase in power consumption, the PD needs to receive an indication of the amount of additional power available, which would require communication of data between the PSE and the PD, which is not provided by the above mentioned specifications.

U.S. patent application publication US 2010/0182024, published Jul. 22, 2010 to Yu, the entire contents of which is incorporated herein by reference, is addressed to a system and method for measuring a cable resistance in a PoE application. A short circuit module in the PD is designed to produce a short circuit effect upon receipt of a cable resistance detection voltage. The PSE can thus measure the resistance of the cable responsive to the produced short circuit at the PD, determine the cable resistance, and if desired utilize the over-allocated power for other PDs. Unfortunately, in order to enable the PD to benefit from the cable resistance measurement, as described above, the PSE would need to provide such data to the PD. Such an arrangement would necessitate a data communication link between the PSE and the PD, thereby adding cost and complexity, and as indicated above is not provided for by the above mentioned specifications.

SUMMARY OF THE INVENTION

Accordingly, it is a principal object of the present invention to overcome at least some of the disadvantages of prior art PoE powering arrangements. This is accomplished in one embodiment by a PoE power utilization arrangement comprising: a current path arranged to carry a current; a return path of the carried current; a voltage detector arranged to detect a first function of a voltage between the current path and the return path during a first time period and during a second time period, the second time period different than the first time period; a current sensor arranged to sense a second function of a magnitude of the carried current during the second time period; and a control circuitry, wherein the control circuitry is arranged to: receive from the voltage detector an indication of the detected first time period voltage function; receive from the voltage detector an indication of the detected second time period voltage function; receive from the current sensor an indication of the detected second time period current magnitude function; responsive to the received first time period voltage function, second time period voltage function and second time period current magnitude function, determine a third function of a resistance seen by the current path; and output an indication of the determined resistance function.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding sections or elements throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The invention is being described in relation to an Ethernet based network, with a powered device being connected thereto. It is to be understood that the powered device is preferably an IEEE 802.3 compliant device preferably employing a 10Base-T, 100Base-T, 1000Base-T or 10 Gigabit connection.

Figure 1:
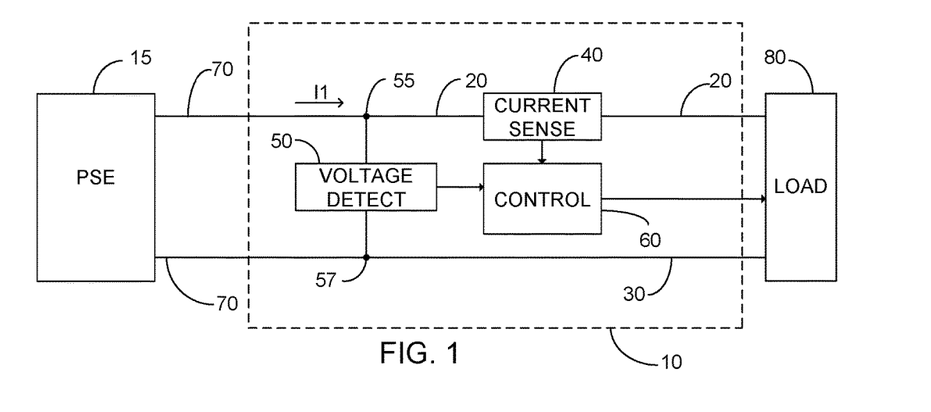
FIG. 1 illustrates a high level block diagram of a PoE power utilization arrangement, according to certain embodiments.

FIG. 1 illustrates a high level block diagram of a PoE power utilization arrangement 10, according to certain embodiments. PoE power utilization arrangement 10 comprises: a current path 20; a current return 30; a current detection circuitry 40; a voltage detector 50; and a control circuitry 60. Current detection circuitry 40 is arranged to sense the magnitude of a current I1 flowing through current path 20. In one embodiment (not shown), current detection circuitry 40 comprises a voltage detector arranged to detect the voltage across a sense resistor situated within current path 20. Current detection circuitry 40 is illustrated as sensing the magnitude of current I1 through current path 20, however this is not meant to be limiting in any way and in another embodiment current detection circuitry 40 is arranged to sense the magnitude of current I1 through current return 30. A first input of voltage detector 50 is coupled to current path 20, at a node 55, and a second input of voltage detector 50 is coupled to current return 30, at a node 57, voltage detector 50 arranged to detect the voltage between current path 20 and current return 30. An output of current sensor 20 and an output of voltage detector 50 are each coupled to a respective input of control circuitry 60. An output of control circuitry 60 is coupled to a load 80, which preferably comprises a DC/DC converter at its input. Current path 20 is coupled to an output of a PSE 15 via a first twisted wire pair 70 and current return 30 is coupled to a return of PSE 15 via a second twisted wire pair 70. Load 80 is supplied between current path 20 and current return 30. Typically, a diode bridge (not shown) is supplied at the input to PoE power utilization arrangement 10 to ensure polarity insensitivity. Thus, in one embodiment voltage detector 50 is supplied across the output of the above mentioned diode bridge. Optionally PoE power utilization arrangement 10 may be incorporated with a PD interface.

In operation, during a first time period, voltage detector 50 is arranged to detect a function of the voltage between current path 20 and current return 30, i.e. between nodes 55 and 57. In one embodiment, during the first time period substantially no current is flowing through current path 20, i.e. current $I1_1=0$. Optionally, current I1 flows through current path 20 responsive to control circuitry 60 and control circuitry 60 is arranged to cease the flow of current $I1_1$ via an appropriate current control circuitry (not shown). An indication of the function of the voltage detected during the first time period is received by control circuitry 60, and denoted V1. In one embodiment, as will be described below, the first time period is less than 250 milliseconds. In another embodiment, current $I1_1$ flows through current path 20 during the first time period and current detection circuitry 40 is arranged to sense a function of the magnitude of current $I1_1$ flowing through current path 20, control circuitry 60 arranged to receive an indication of the sensed current magnitude function from current detection circuitry 40. Preferably, the current magnitude function is sensed substantially simultaneously with the voltage function detection of voltage detector 50 such that the magnitude of current $I1_1$ doesn't change between the detection of voltage V1 and the current sensing of current $I1_1$.

During a second time period, optionally succeeding the first time period, voltage detector 50 is further arranged to again detect the function of the voltage between current path 20 and current return 30, denoted V2. During the second time period, current detection circuitry 40 is arranged to sense a function of the magnitude of current I1 flowing through current path 20, denoted $I1_2$, control circuitry 60 arranged to receive an indication of the sensed current magnitude function $I1_2$ from current detection circuitry 40. Preferably, the current magnitude function $I1_2$ is sensed substantially simultaneously with the voltage function detection of voltage detector 50 such that the magnitude of current $I1_2$ doesn't change between the detection of voltage V2 and the sensing of current $I1_2$.

Control circuitry 60 is arranged to determine the resistance between the outputs of PSE 15 and nodes 55, 57 by the respective twisted wire pair 70 responsive to the voltage function indication of the first time period, the voltage function indication of the second time period and the current magnitude function indication of the second time period. In the embodiment where current detection circuitry 40 is arranged to sense a function of the magnitude of current $I1_1$ during the first time period, the resistance of the respective twisted wire pair 70 is determined further responsive to the current magnitude function indication $I1_1$. The resistance of the respective twisted wire pair 70, is determined as:

$$(V1-V2)/(I1_2-I1_1) \qquad \text{EQ. 1.}$$

As indicated above, in one embodiment $I1_1$ is zero, and thus the EQ. 1 simplifies to $(V1-V2)/I1_2$. The voltage between nodes 55 and 57 equals the voltage between the output and return of PSE 15, less the voltage drop across twisted wire pairs 70 due to current I1 flowing therethrough. As a result, in the embodiment where there is no current flow during the first time period, the voltage drop across twisted wire pairs 70 is zero and the voltage between nodes 55 and 57 equals the voltage between the output and return of PSE 15. As described above, an indication of a respective function of each of V1, V2, $I1_1$ and $I1_2$ are received by control circuitry 60. In one embodiment, control circuitry 60 is arranged to calculate the resistance of twisted wire pairs 70 responsive to the respective functions. In another embodiment, control circuitry 60 is arranged to determine a function of the resistance of twisted wire pairs 70 responsive to the respective functions.

As will be described further below, in one embodiment control circuitry 60 is further arranged to compensate for voltage drops across diodes of the diode bridge (not shown) between PSE 15 and node 55 of current path 20.

Control circuitry 60 is arranged to output an indication of the determined resistance, or function of the resistance, of twisted wire pairs 70. In one embodiment, the output resistance indication is received by a control unit of load 80 coupled between current path 20 and current return 30 and load 80 is arranged to draw current responsive to the received indication. Particularly, an increased amount of current is drawn by load 80 responsive to a lower resistance of twisted wire pairs 70 and a reduced amount of current is drawn by load 80 responsive to a greater resistance of twisted wire pairs 70. As described above, PSE 15 is arranged to allocate enough power for the maximum power consumption of the respective class presented by load 80 and the power loss caused by the resistance between PSE 15 and load 80, which the resistance is at maximum. Therefore, in the event of a low resistance between PSE 15 and load 80, due to a short length of twisted wire pairs 70, and/or a low cable resistance, the power loss will be low and there is sufficient power for load 80 to increase its power consumption above the maximum power consumption of the prior art. Responsive to an indication of a maximum resistance between PSE 15 and nodes 55, 57, load 80 is arranged to not consume more power than the maximum value of the respective class of load 80.

Figure 2A:
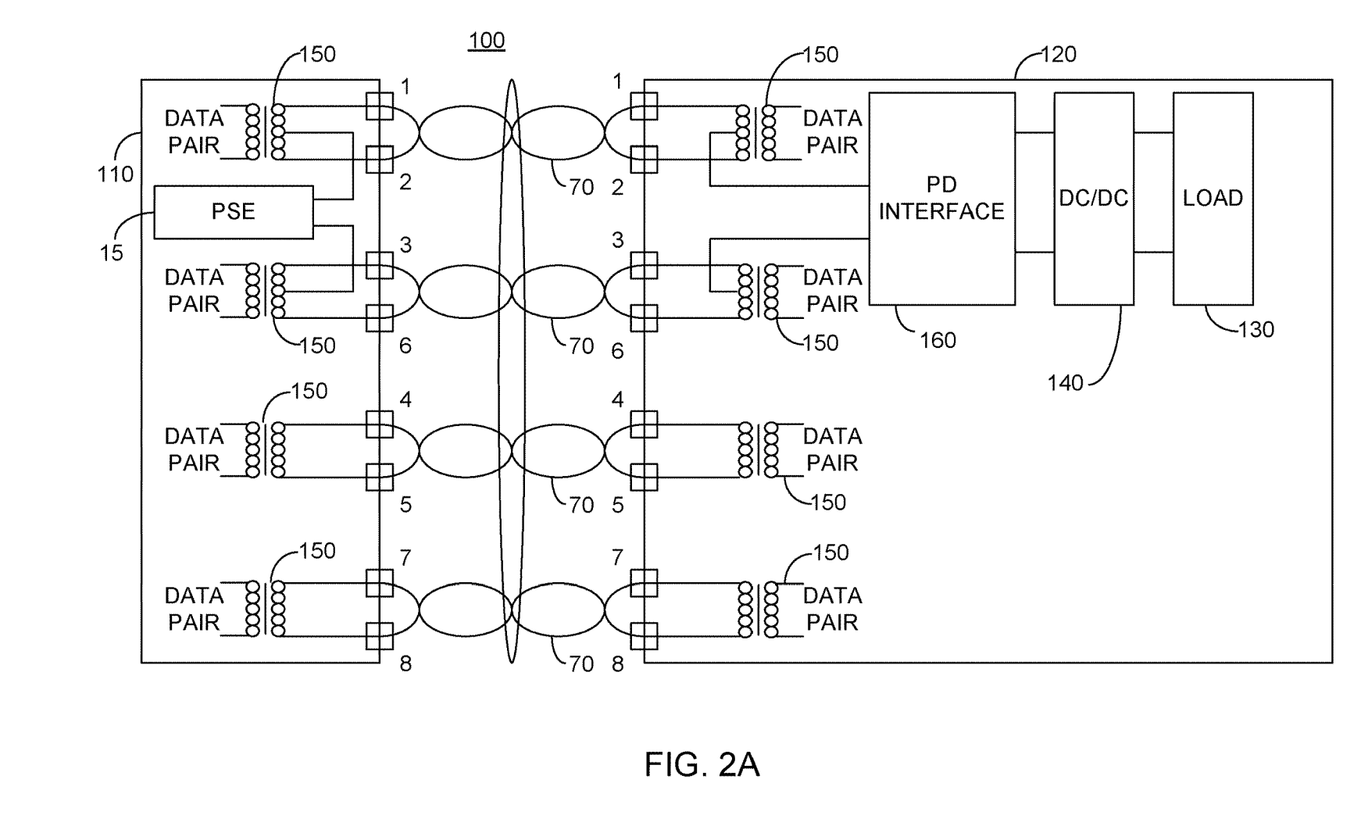
FIGS. 2A-2B illustrate a high level schematic diagram of a PoE powering arrangement comprising the PoE power utilization arrangement of FIG. 1, according to certain embodiments.

FIG. 2A illustrates a high level schematic diagram of a PoE powering arrangement 100, comprising: a switch/hub 110; a plurality of twisted wire pairs 70, constituted within a structured cable; and a PD 120, comprising a load 130, a DC/DC power converter 140, a plurality of data transformers 150 and a PD interface 160. Switch/hub 110 comprises a plurality of data transformers 150 and a PSE 15. A data wire pair is coupled across the primary winding of each data transformer 150 in switch/hub 110 and a first end of each twisted wire pair 70 is coupled across the secondary winding of each data transformer 150 in switch/hub 110 via respective connections, listed conventionally in two groups: connections 1, 2, 3, 6; and connections 4, 5, 7 and 8. The outputs of PSE 15 are respectively connected to the center taps of the secondary windings of data transformers 150 of switch/hub 110 connected to twisted wire pairs 70 via connections 1, 2, 3 and 6.

A data wire pair is connected across the primary winding of each data transformer 150 in PD 120 and a second end of each twisted wire pair 70 is connected across the secondary winding of each data transformer 150 in PD 120 via respective connections, listed conventionally in two groups: connections 1, 2, 3, 6; and connections 4, 5, 7 and 8. The inputs of PD interface 160 are respectively connected to the center taps of the secondary windings of data transformers 150 of PD 120 connected to twisted pairs 70 via connections 1, 2, 3 and 6. Load 130 is coupled to PD interface 160 via DC/DC power converter 140. Optionally DC/DC power converter 140 is responsive to a control output of PD interface 160.

The above has been illustrated in an embodiment wherein a single PSE 15 is arranged to provide power over two twisted wire pairs 70, however this is not meant to be limiting in any way. In another embodiment (not shown), switch/hub 110 comprises a pair of PSEs 15, each arranged to provide power over a respective pair of twisted wire pairs 70. Additionally, PSE 15 may be arranged to provide power over connections 4, 5, 7 and 8 instead of connections 1, 2, 3, 6. PSE 15 is illustrated as being part of switch/hub 110 however this is not meant to be limiting in any way, and midspan equipment may be utilized to provide a connection for PSE 15 without exceeding the scope. PSE 15 may be any equipment arranged to provide power over communication cabling, including equipment meeting the definition of a PSE under any of IEEE 802.3af-2003 and IEEE 802.3at-2009, without limitation. As indicated above, PD interface 160 may comprise an embodiment of PoE power utilization arrangement 10 as described above.

Figure 2B:
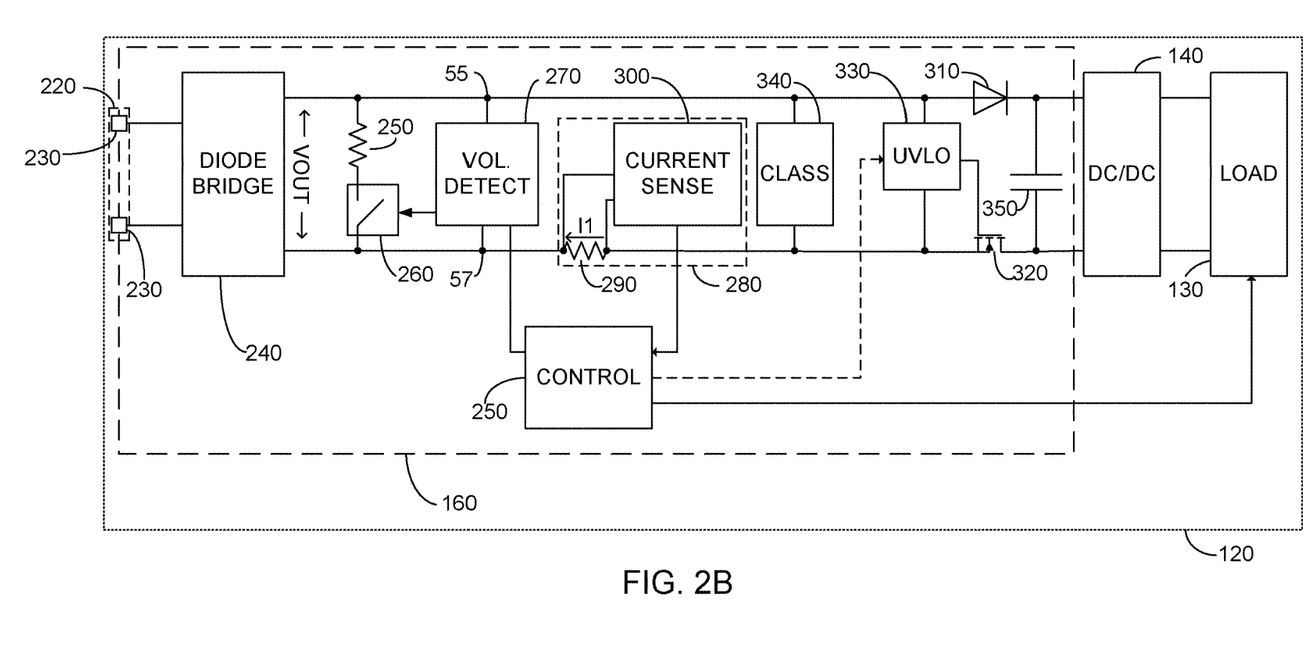

FIG. 2B illustrates a high level schematic diagram of PD 120, with a more detailed illustration of PD interface 160. PD interface 160 comprises: a power reception port 220, comprising a pair of port nodes 230; a diode bridge 240; a signature resistive element 250; an electronically controlled switch 260, denoted herein as "resistance switch 260" for clarity; a voltage detector 270 coupled across nodes 55, 57; a current detection circuitry 280 comprising a sense resistor 290 and a current sensor 300; a unidirectional electronic valve 310, denoted herein as "valve 310" for brevity; an isolation electronically controlled switch 320, denoted herein as "isolation switch 320" for brevity; an under voltage lock-out (UVLO) circuit 330; a class circuit 340; and an input capacitance element 350.

For clarity, the arrangement of FIGS. 2A-2B will be described together. In one embodiment, signature resistive element 250 comprises a resistor exhibiting a resistance of 25.0 kΩ. In another embodiment, valve 310 comprises a diode and is described herein as such for simplicity. In another embodiment, isolation switch 320 comprises an n-channel metal-oxide-semiconductor field-effect transistor (NMOSFET), and is described herein as such for simplicity. In one embodiment, input capacitance element 350 comprises a capacitor.

Each input of diode bridge 240 is coupled to a center tap of the secondary winding of a respective data transformer 150 of PD 120 via a respective port node 230 of power reception port 220. The positive output of diode bridge 240 is coupled to a first end of signature resistive element 250, a first input of voltage detection circuitry 270 at node 55, a first input of UVLO circuit 330, an input of class circuit 340 and the anode of valve 310. The cathode of valve 310 is coupled to a first end of input capacitance element 350 and a positive input of DC/DC converter 140. A power output of DC/DC converter 140 is coupled to the input of load 130. The return of load 130 is coupled to a return input of DC/DC converter 140. A return output of DC/DC converter 140 is coupled to the second end of input capacitance element 350 and the drain of isolation switch 320. The gate of isolation switch 320 is coupled to an output of UVLO circuit 330. The source of isolation switch 320 is coupled to a second input of UVLO circuit 330, an output of class circuit 340, a first end of sense resistor 290 and a first input of current sensor 300 of current detection circuitry 280. A second end of sense resistor 290 is coupled to a second input of current sensor 300, a second input of voltage detection circuitry 270 at node 57, a first terminal of resistance switch 260 and a return of diode bridge 240. The second terminal of resistance switch 260 is coupled to a second end of signature resistive element 250 and a control input of resistance switch 260 is in communication with a respective output of voltage detection circuitry 270. Voltage detection circuitry 270 and current sensor 300 are each in communication with control circuitry 250 and control circuitry 250 is further in communication with load 130 and optionally in communication with UVLO circuit 330, connection shown as a dotted line, and optionally with DC/DC converter 140 (connection not shown).

In operation, PSE 15 is arranged to implement a detection stage. In the detection stage, a first detection signal, exhibiting a first voltage value, is output for a first detection time period. Additionally, a second detection signal, exhibiting a second voltage value, is output for a second detection time period, in accordance with the standards described above. The first and second voltage values are in the range of 2.8-10 V, with a difference of at least 1V between the first voltage and the second voltage. The second detection time period begins at least 2 ms after the end of the first detection time period and the overall period from the beginning of the first detection time period to the end of the second detection time period is less than 500 ms.

Voltage detection circuitry 270 is arranged to detect the potential difference between the output and return of diode bridge 240, denoted VOUT, and enable/disable resistance switch 260 responsive thereto. In particular, in the event that VOUT is greater than a predetermined minimum detection stage voltage value, optionally 12V, voltage detection circuitry 270 is arranged to open resistance switch 260, with resistance switch 260 is arranged to be normally closed in the absence of an active signal from voltage detection circuit 270. Thus, for the first and second detection signals signature resistive element 250 is presented to PSE 15 via diode bridge 240. The above mentioned function of voltage detection circuitry 270 may alternately performed by control circuitry 250 without limitation.

PSE 15 is arranged to determine the signature resistance of PD interface 160, i.e. determine the resistance of signature resistive element 250, responsive to the output first and second detection signals. In particular, as described above, PSE 15 is in electrical communication with signature resistive element 250 via diode bridge 240, responsive to resistance switch 260 being closed during the detection stage. Thus, PSE 15 is able to determine the resistance of signature resistive element 250 responsive to the applied first and second voltages, as known to those skilled in the art at the time of the invention. Valve 310 isolates input capacitance element 350 from signature resistive element 250, therefore charge stored on input capacitance element 350 is prevented from being transferred to signature resistive element 250 and therefore does not impact the resistance detection by PSE 15.

Additionally, UVLO circuit 330 is arranged to maintain isolation switch 320 open as long as voltage VOUT is less than a predetermined minimum operating voltage value, optionally 30-35 V. The above first and second detection signals each exhibit a voltage less than the predetermined minimum operating voltage value, therefore isolating switch 320 is open during the detection stage and input capacitance element 350 is isolated from PSE 15. As described above in relation to signature resistive element 250, valve 310 isolates UVLO circuit 330 from input capacitance element 350 such that UVLO circuit 330 reads the voltage output by PSE 15 and not the potential difference across input capacitance element 350.

PSE 15 is arranged to compare the determined signature resistance with a predetermined resistance range, in accordance with the standards described above. In one embodiment, the predetermined resistance range is 19-26.5 kΩ. In another embodiment, the lower boundary of the predetermined resistance range is 15-19 kΩ and the upper boundary of the predetermined resistance ranged is 26.5-33 kΩ. In the event that the determined signature resistance is within the predetermined resistance range, it is determined that a valid PD 120 is coupled to twisted wire pairs 70 and power can be provided thereto. In the event that the determined signature resistance is not within the predetermined resistance range, it is determined that a valid PD is not coupled to twisted wire pairs 70 and power is not provided. PSE 15 is then arranged to again perform detection after a predetermined time period.

In the event that PSE 15 determines that a valid PD 120 is coupled to twisted wire pairs 70, PSE 15 is further optionally arranged to implement a classification stage. In the classification stage, PSE 15 is arranged to output a classification signal to class circuit 340, the classification signal exhibiting a voltage greater than the voltage of the first and second detection signals of the detection stage, optionally 15.5-20.5 V. Class circuit 340 outputs a predetermined current to PSE 15 indicating the class of PD 120, in accordance with the standards described above. PSE 15 is arranged to receive the current output by class circuit 340 and determine the class of PD 120 responsive to the received current.

Responsive to the detection and classification stages, PSE 15 is arranged to provide DC operating power to load 130 via DC/DC converter 140. The voltage at the output of PSE 15 when providing operating power is in a range greater than the voltage range of the detection and classification stages described above, optionally 44-57 V. As described above in relation to PoE power utilization arrangement 10, which as indicated above may be implemented within an embodiment of PD interface 160, during a first time period voltage detection circuit 270 is arranged to detect the value of voltage VOUT. In one embodiment, as described above, substantially no current is being drawn over twisted wire pairs 70. Optionally, control circuitry 250 is arranged to control UVLO circuit 330 to postpone closing of isolating switch 320 until receiving an indication of the detected voltage. After closing of isolating switch 320, current is drawn by load 130. As described above, voltage detection circuit 270 is further arranged to detect the value of voltage VOUT when current is being drawn by load 130, and current sensor 300 is arranged to sense the magnitude of the current flowing through resistor 290, indications thereof being received by control circuitry 250, the current denoted I1. Preferably, the voltage detection of voltage detection circuit 270 and the current magnitude sensing of current sensor 300 are performed generally simultaneously so that there will be no substantial change in the magnitude of current I1 between the voltage detection and the current magnitude sensing. As described above, the resistance of twisted wire pairs 70 is determined responsive to: the received indications of the value of voltage VOUT both when current is being drawn by load 130 and when current is not being drawn by load 130; and the received indication of the magnitude of current I1 flowing through resistor 290. Control circuitry 250 is further arranged to output the determined resistance to a control unit of load 130 (not shown), load 130 arranged to increase/decrease power consumption responsive to the determined resistance, as described above.

In another embodiment, as described above, control circuitry 250 is arranged during a first time period to adjust the magnitude of current I1 to exhibit a first value $I1_1$ and is further arranged during a second time period to adjust the magnitude of current I1 to exhibit a second value $I1_2$, optionally responsive to a communication with load 130. An indication of the magnitude of current I1 and the value of voltage VOUT during each of the first and second time periods is received by control circuitry 250, the resistance of twisted wire pairs 70 determined responsive thereto. Alternatively, current limiting functionality may be provided in control of electronically controlled switch 320 to limit current to a predetermined value so as to obtain $I1_1$, with $I1_2$ responsive to the draw of load 130.

In the event that PD 120 is switched off or disconnected, i.e. load 130 no longer draws current from PSE 15, PSE 15 is arranged to cease outputting voltage for a predetermined time period. Particularly, PSE 15 monitors the current being drawn therefrom and determines if the current being drawn therefrom is less than a predetermined minimum current draw value. In one embodiment, the predetermined minimum power draw value is power of less than 10 mA being drawn over a period of 300-400 ms. As described above, control circuitry 250 is arranged to prevent current draw by load 130 while voltage detection circuitry 270 is detecting the voltage between the output and return of diode bridge 240 to determine $I1_1$. Control circuitry 250 is preferably arranged such that the current draw prevention is for less than 250 ms to avoid shut down of power by PSE 15 due to detecting a current draw of less than the predetermined minimum current draw value.

As described above in relation to EQ. 1, the resistance between PSE 15 and PD 120 is determined responsive to the difference between the value of voltage VOUT measured during a first time period, denoted V1, and the value of voltage VOUT measured during a second time period, denoted V2. EQ. 1 assumes that the voltage drop across diode bridge 240 is equal at all current levels. In reality this is not 100% accurate, except for an ideal diode. In one embodiment, control circuitry 250 is arranged to compensate for this inaccuracy by determining the difference between V1 and V2, plus the additional voltage drop caused by the change in current across diode bridge 240. In one embodiment a compensation of 0.3V is added to the change in voltage to compensate for the additional voltage drop.

Figure 3:
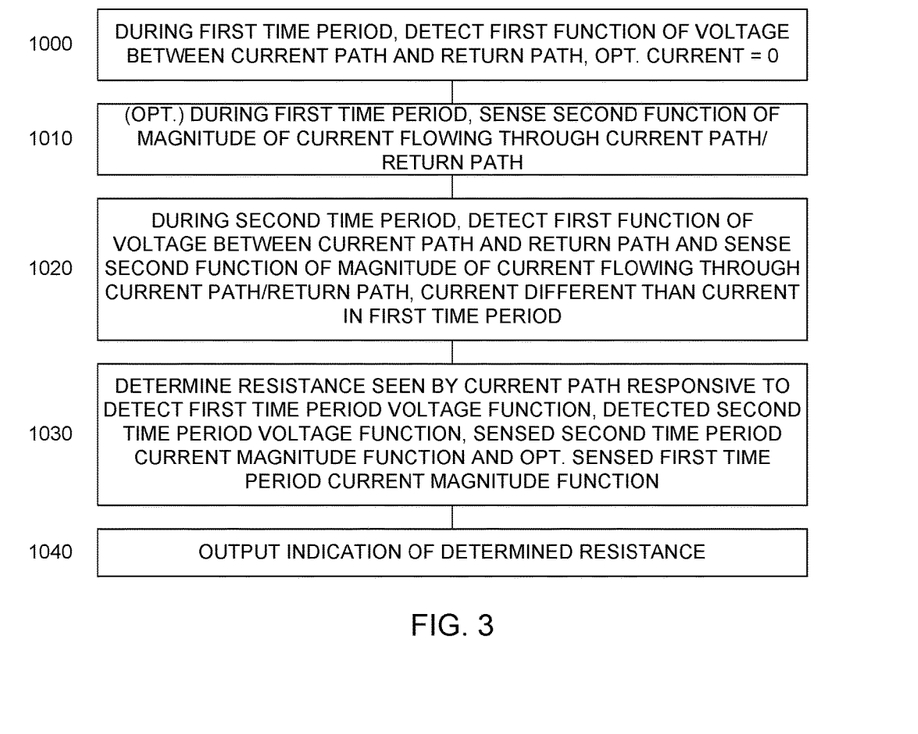
FIG. 3 illustrates a high level flow chart of a PoE power utilization method, according to certain embodiments.

FIG. 3 illustrates a high level flow chart of a PoE power utilization method, according to certain embodiments. In stage 1000, during a first time period, a first function of the voltage between a current path and a return path is detected. In one embodiment, the voltage detected is a function of the voltage across the output of a diode bridge of a PD interface. Optionally, substantially zero current flows through the current path during the first time period.

In optional stage 1010, during the first time period, a second function of the magnitude of current flowing through the current path/return of stage 1000 is sensed. As described above, current is carried by the current path to the load, and is carried by the return path from the load to the PSE. Thus, the current flowing through the current path and the return paths are equal.

In stage 1020, during a second time period, a first function of the voltage between the current path and the return path is again detected. Additionally, during the second time period, a second function of the magnitude of current flowing through the current path of stage 1000 is again sensed. The magnitude of current flowing through the current path during the second time period is different than the magnitude of the current flowing through the current path during the first time period of stage 1010.

In stage 1030, responsive to the detected first time period voltage function of stage 1000, the detected second time period voltage function of stage 1010 and the sensed second time period current magnitude function of stage 1010, a third function of a resistance seen by the current path is determined. Particularly, the resistance of the path between a PSE and the current path of the PD interface of stage 1000 is determined. Optionally, the resistance is further determined responsive to the sensed first time period current magnitude function of optional stage 1010. In stage 1040, an indication of the determined resistance function is output, optionally to a PD control circuitry.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination. In particular, the invention has been described with an identification of each powered device by a class, however this is not meant to be limiting in any way. In an alternative embodiment, all powered device are treated equally, and thus the identification of class with its associated power requirements is not required.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description.

The invention claimed is:

1. A power over Ethernet power utilization arrangement comprising:
   a current path arranged to carry a current between a power sourcing equipment and a powered device (PD), the PD comprising a load;
   a return path of the carried current;
   a voltage detector in the PD arranged to detect a first function of a voltage between said current path and said return path during a first time period and during a second time period, said second time period different than said first time period;
   a current sensor in the PD arranged to sense a second function of a magnitude of the carried current during said second time period; and
   a control circuitry in the PD,
   wherein said control circuitry in the PD is arranged to:
      receive from said voltage detector an indication of said detected first time period voltage function;
      receive from said voltage detector an indication of said detected second time period voltage function;
      receive from said current sensor an indication of said detected second time period current magnitude function;
      responsive to said received first time period voltage function, second time period voltage function and second time period current magnitude function, determine a third function of a resistance seen by said current path; and
      output an indication of said determined resistance function to said load.

2. The arrangement of claim 1, wherein said current sensor is further arranged to sense a second function of the magnitude of the carried current during said first time period, and
   wherein said control circuitry is further arranged to receive from said current sensor an indication of said detected first time period current magnitude function, said resistance function determination further responsive to said received first time period current magnitude function.

3. The arrangement of claim 2, wherein the magnitude of the carried current during said second time period is different than the magnitude of the carried current during said first time period.

4. The arrangement of claim 3, wherein the magnitude of the carried current during said first time period is substantially zero.

5. The arrangement of claim 2, wherein the magnitude of the carried current during said first time period is substantially zero.

6. The arrangement of claim 1, wherein said load is arranged to increase, or decrease, an amount of power consumption responsive to said output indication of said determined resistance function.

7. The arrangement of claim 1, wherein said control circuitry in the PD is arranged to control the magnitude of the carried current during said second time period to be different than the magnitude of the carried current during said first time period.

8. A power over Ethernet power utilization method for a powered device (PD) arranged to receive power over twisted wire pairs from a power sourcing equipment, the method comprising:
   detecting at the PD a first function of a voltage between a current path node and a current return path node during a first time period and during a second time period, said second time period different than said first time period;
   sensing at the PD a second function of the magnitude of a current flowing through the current path node and return path node during said second time period;
   responsive to said detected first time period voltage function, said detected second time period voltage function and said sensed second time period current magnitude function, determining at the PD a third function of a resistance seen by the current path; and
   outputting an indication of said determined resistance function to a load of the PD.

9. The method of claim 8, further comprising sensing at the PD a second function of the magnitude of current flowing through the current path node and return path node during said first time period, said resistance function determination further responsive to said sensed first time period current magnitude function.

10. The method of claim 9, wherein the magnitude of current flowing through the current path node and return path node during said second time period is different than the magnitude of current flowing through the current path node and return path node during said first time period.

11. The method of claim 9, wherein the magnitude of current flowing through the current path node and return path node during said first time period is substantially zero.

12. The method of claim 8, wherein the magnitude of current flowing through the current path node and return path node during said first time period is substantially zero.

13. The method of claim 8, further comprising:
    increasing, or decreasing, an amount of power consumption of the load responsive to said output indication of said determined resistance function.

14. The method of claim 8, further comprising:
    controlling, at the PD, the magnitude of the carried current during said second time period to be different than the magnitude of the carried current during said first time period.

* * * * *